United States Patent
Cho

(10) Patent No.: US 7,211,859 B2
(45) Date of Patent: May 1, 2007

(54) SEMICONDUCTOR DEVICE AND MANUFACTURING METHOD THEREOF

(75) Inventor: Yong-Soo Cho, Daejeon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/316,633

(22) Filed: Dec. 20, 2005

(65) Prior Publication Data

US 2006/0138569 A1 Jun. 29, 2006

(30) Foreign Application Priority Data

Dec. 29, 2004 (KR) .................. 10-2004-0115192

(51) Int. Cl.
*H01L 29/78* (2006.01)
*H01L 21/336* (2006.01)
(52) U.S. Cl. ..................... 257/327; 438/299
(58) Field of Classification Search ........... 257/327; 438/299
See application file for complete search history.

(56) References Cited

U.S. PATENT DOCUMENTS

| 6,316,323 B1 * | 11/2001 | Fang et al. ............. 438/305 |
| 2001/0055842 A1 * | 12/2001 | Uh et al. ................ 438/183 |
| 2004/0197995 A1 * | 10/2004 | Lee et al. ............... 438/257 |
| 2005/0139932 A1 * | 6/2005 | Cho ....................... 257/370 |

* cited by examiner

*Primary Examiner*—Evan Pert
(74) *Attorney, Agent, or Firm*—Andrew D. Fortney

(57) ABSTRACT

A semiconductor device according to a exemplary embodiment of the present invention includes a reverse spacer exposing a part of an epitaxial silicon layer on a silicon substrate, a gate oxide layer on at least the epitaxial silicon layer and a gate polysilicon layer on the gate oxide layer and at least part of the reverse spacer, and source/drain terminals including a first doped (shallow junction) region in the silicon substrate at a position exterior to the exposed epitaxial silicon layer and a second doped (deep junction) region neighboring the first doped region. The semiconductor device can thus have an epitaxial silicon channel of nanometer size, an ultra-shallow junction, and a deep junction.

20 Claims, 4 Drawing Sheets

SEMICONDUCTOR DEVICE AND MANUFACTURING METHOD THEREOF

CROSS-REFERENCE TO RELATED APPLICATION

This application claims priority to and the benefit of Korean Patent Application No. 10-2004-0115192, filed in the Korean Intellectual Property Office on Dec. 29, 2004, the entire contents of which are incorporated herein by reference.

BACKGROUND OF THE INVENTION (a) Field of the Invention

The present invention relates to a semiconductor device and a method thereof. More particularly, the present invention relates to a transistor having a reverse spacer and a manufacturing method thereof.

(b) Description of the Related Art

Generally, the size of transistors used in integrated circuits of semiconductor devices has been reduced, and transistors of a nanometer scale (e.g., 130 nm, 110 nm, 90 nm, 65 nm or 45 nm) are now desired. For manufacturing nanometer scale transistors, an advanced apparatus and advanced technology are generally used. In particular, advanced technology for forming a very shallow junction and an advanced photolithography apparatus are generally used for manufacturing a nanometer scale transistor.

Furthermore, a higher channel doping concentration is generally beneficial when scaling down typical transistors. However, if the channel doping concentration is increased, mobility of a charge carrier decreases so the performance of the transistor may deteriorate.

The above information disclosed in this Background section is only for enhancement of understanding of the background of the invention, and therefore, it may contain information that does not form prior art or other information that may be already known in this or any other country to a person of ordinary skill in the art.

SUMMARY OF THE INVENTION

The present invention has been made in an effort to provide a semiconductor device and a method thereof having advantages of forming a nanometer scale transistor by using a reverse spacer and typical (e.g., ≧nanometer scale) process technology.

An exemplary semiconductor device according to an embodiment of the present invention includes a reverse spacer that exposes a part of an epitaxial silicon layer (which may comprise strained silicon or be part of a "strained silicon" substrate), a gate oxide layer and a gate polysilicon layer on the epitaxial silicon layer and (at least in part) on the reverse spacer, and source/drain terminals comprising a first doped region having a shallow junction in the silicon substrate at a position exterior to the exposed epitaxial silicon layer and a second doped region having a deep junction neighboring the first doped region.

In addition, another exemplary semiconductor device according to an embodiment of the present invention includes a reverse spacer exposing a part of a highly doped epitaxial silicon layer on a silicon substrate, an undoped epitaxial silicon layer under the highly doped epitaxial silicon layer, a gate oxide layer and a gate polysilicon layer on the highly doped epitaxial silicon layer and (at least in part) on the reverse spacer, and source/drain terminals comprising a first doped region having a shallow junction in the silicon substrate at a position exterior to the exposed epitaxial silicon layer and a second doped region having a deep junction neighboring the first doped region.

An exemplary method of manufacturing a semiconductor device according to an embodiment of the present invention includes introducing germanium ions into a silicon substrate; forming a first epitaxial silicon layer on the silicon substrate; forming a hard mask pattern on the first epitaxial silicon layer; forming a second epitaxial silicon layer on the first epitaxial silicon layer at a position exposed by the hard mask pattern; removing the hard mask pattern; forming a reverse spacer on a sidewall of the second epitaxial silicon layer so as to expose a part of the first epitaxial silicon layer; forming a gate oxide layer and a gate polysilicon layer on the exposed first epitaxial silicon layer and (at least in part) on the reverse spacer; forming a first doped (shallow junction) region under the reverse spacer; forming a gate spacer on sidewalls of the gate polysilicon layer; and forming a second doped (deep junction) region neighboring the first doped region so as to form source/drain terminals (e.g., comprising the first doped region and the second doped region).

Another exemplary method of manufacturing a semiconductor device according to another embodiment of the present invention includes sequentially forming an undoped first epitaxial silicon layer and a highly doped second epitaxial silicon layer on a silicon substrate; forming a hard mask pattern on the second epitaxial silicon layer; forming a third epitaxial silicon layer on the second epitaxial silicon layer at a position exposed by the hard mask pattern; removing the hard mask pattern; forming a reverse spacer on a sidewall of the third epitaxial silicon layer so as to expose a part of the second epitaxial silicon layer; forming a gate oxide layer and a gate polysilicon layer on the exposed second epitaxial silicon layer and (at least in part) on the reverse spacer; forming a first doped (shallow junction) region under the reverse spacer; forming a gate spacer on sidewalls of the gate polysilicon layer; and forming a second doped (deep junction) region neighboring the first doped region so as to form source/drain terminals (e.g., comprising the first doped region and the second doped region).

As described above, according to an exemplary embodiment of the present invention, a transistor having a channel of nanometer size, a shallow junction, and a deep junction can be made using a reverse spacer (and, in general, one or more epitaxial silicon layers, at least one of which may be part of a strained silicon substrate).

DETAILED DESCRIPTION OF THE EMBODIMENTS

Figure 1:
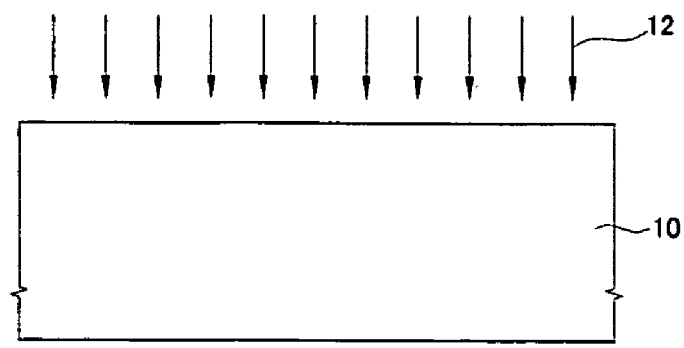
FIG. 1 to FIG. 6 are cross-sectional views showing principal stages of a semiconductor device according to a first exemplary embodiment of the present invention.

An exemplary embodiment of the present invention will hereinafter be described in detail with reference to the accompanying drawings.

First, a structure of a transistor according to a first exemplary embodiment of the present invention will be described with reference to FIG. 6.

A reverse spacer 20 exposes an epitaxial silicon channel 14a, which is a part of an epitaxial silicon layer on a silicon substrate 10. In other words, the epitaxial silicon channel 14a having a nanometer size is between (and below) the reverse spacer 20, which is formed in a direction opposite to a typical gate spacer.

A gate oxide layer (not shown) and a gate polysilicon layer 22 are sequentially formed on the epitaxial silicon channel 14a and at least in part on the reverse spacer 20. A source/drain terminal 32 includes (1) a first doped region 24 having a shallow junction in the silicon substrate 10 at a position exterior to the epitaxial silicon channel 14a and (2) a second doped region 28 having a deep junction neighboring the first doped region 24.

A raised source/drain 18a may comprise another (or second) epitaxial silicon layer on the second doped region 28, generally having dopant ions therein (which may be implanted into the second epitaxial silicon layer). A metal silicide layer 30 may be formed on the raised source/drain 18a and gate polysilicon layer 22.

Now, a method for manufacturing the transistor according to the first exemplary embodiment of the present invention will be described with reference to FIGS. 1 to 6.

FIG. 1 to FIG. 6 include cross-sectional views showing principal stages of manufacturing a semiconductor device according to the first exemplary embodiment of the present invention.

Referring to FIG. 1, germanium (Ge) ions 12 may be introduced into the silicon substrate 10. The introduced germanium ions 12 may introduce lattice strain into a first epitaxial silicon layer deposited or grown on the silicon substrate 10 in a subsequent process.

Figure 2:
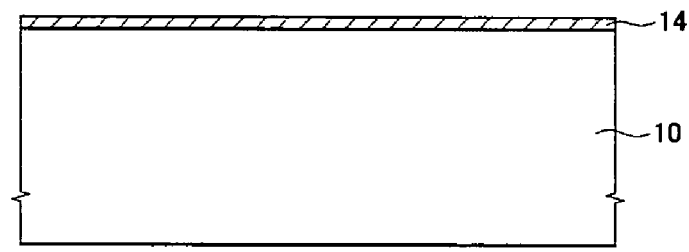
Figure 3:
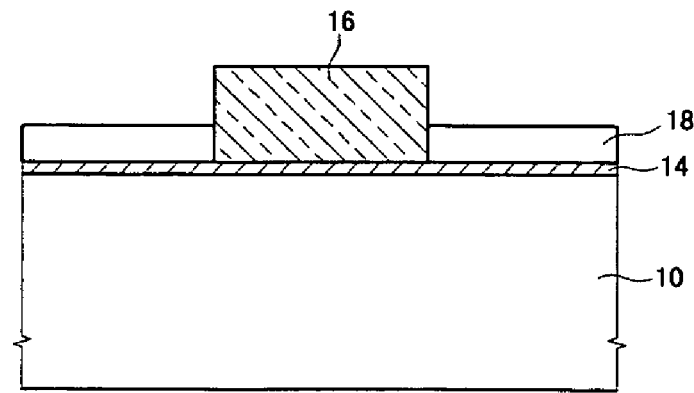

Referring to FIG. 2 and FIG. 3, the first epitaxial silicon layer 14 is formed (usually by epitaxial growth) on the silicon substrate 10. The first epitaxial silicon layer 14 typically has a thickness characteristic of a nanometer scale transistor channel depth. Subsequently, a hard mask pattern 16 (generally comprising a material that can be selectively etched and removed, relative to [poly]crystalline silicon, such as silicon nitride or silicon dioxide) is formed on the first epitaxial silicon layer 14 (typically by blanket deposition, photolithographic patterning of a photoresist deposited thereon, and etching), for subsequently forming a reverse spacer. A second epitaxial silicon layer 18 is formed on the first epitaxial silicon layer 14 at positions of the first epitaxial silicon layer 14 exposed by the hard mask pattern 16.

Figure 4:
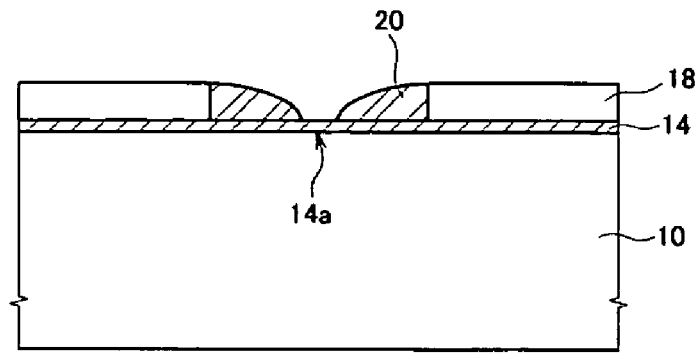

Referring to FIG. 4, after removing the hard mask, a reverse spacer 20 is formed on a sidewall of the second epitaxial silicon layer 18 (generally by blanket deposition and anisotropic etching) so that an epitaxial silicon channel 14a is defined by the gap between reverse spacers 20 located within sidewalls of second epitaxial silicon layer 18 that face each other. The reverse spacer 20 is formed in a direction opposite to a typical gate spacer structure. A part of the first epitaxial silicon layer between the reverse spacer 20 is exposed, to form an epitaxial silicon channel 14a. The reverse spacer 20 may comprise or consist essentially of silicon dioxide and/or silicon nitride (e.g., a TEOS-SiN-TEOS trilayer stack or a TEOS-based oxide alone).

Figure 5:
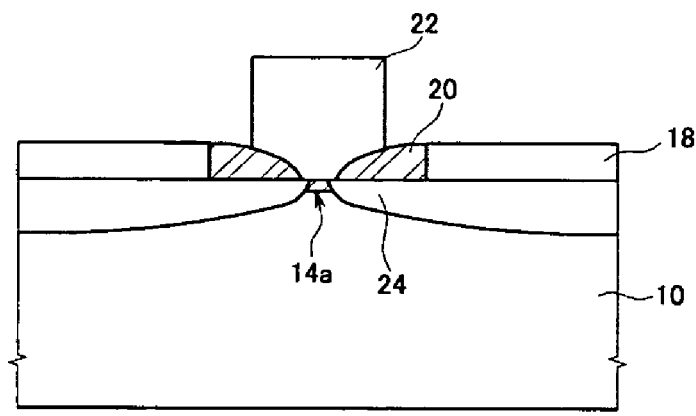

Referring to FIG. 5, a gate oxide layer (not shown) and a gate polysilicon layer 22 are formed on the epitaxial silicon layer 14a and at least in part on the reverse spacer 20, typically by blanket deposition, photolithographic patterning of a photoresist deposited thereon, and etching. Alternatively, the gate oxide layer may be formed by wet or dry thermal oxidation (e.g., of the exposed epitaxial silicon layer). Notably, polysilicon gate 22 may have a length smaller than a distance between sidewalls of second epitaxial silicon layer 18 that face each other. Subsequently, a first doped region 24 having a shallow junction is formed by implanting dopant ions into the silicon substrate 10 having the gate polysilicon layer 22 thereon so as to form an LDD structure (and, optionally, a pocket structure). Such an adoption of the reverse spacer 20 enables an effective nanometer scale gate to be formed using typical (e.g., non-nanometer scale) process technology. In addition, an ultra-shallow junction can be formed without the help of an advanced implantation apparatus using very low implantation energy under the gate polysilicon layer 22, by using the reverse spacer 20.

Figure 6:
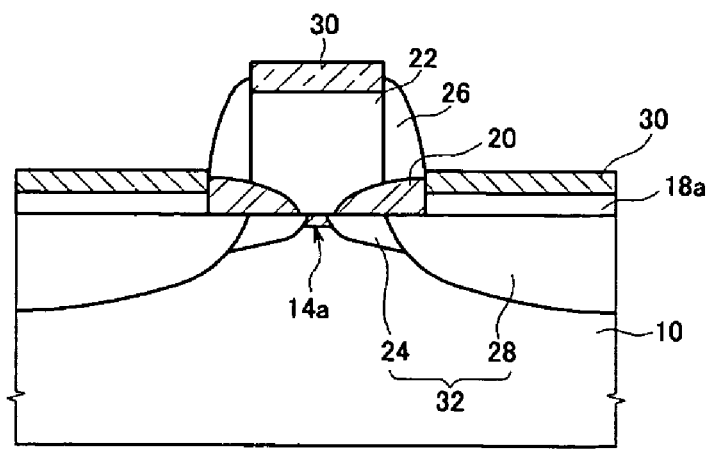

Referring to FIG. 6, after a conventional gate spacer 26 is formed on sidewalls of the gate polysilicon layer 22, a second doped region 28 having a deep junction is formed by deep implantation of one or more dopants for the source/drain terminals. Consequently, source/drain terminals 32 typically include the first doped region 24 under the gate polysilicon layer 22 and the second doped region 28 neighboring the first doped region 24.

Subsequently, a metal silicide layer 30 may be formed on the gate polysilicon layer 22 and on the second epitaxial silicon layer 18 over the second doped region 28 by a silicidation process. During the silicidation process, if a lower part of the second epitaxial silicon layer 18 on the second doped region 28 is not silicided, then a raised (non-silicided) source/drain 18a can be formed.

In such a structure, an ultra-shallow junction in a silicon substrate and an improved parasitic resistance beneficial in a nanometer scale transistor can be obtained. In addition, adoption of the raised source/drain can reduce defects that may result from silicidation of germanium (e.g., from the implantation of the silicon substrate). According to the exemplary embodiment of the present invention, a nanoscale transistor can be formed even if typical (non-nanoscale) process technology is used.

Now, a structure of a transistor according to a second exemplary embodiment of the present invention will be described with reference to FIG. 12.

A reverse spacer 52 exposes a highly doped epitaxial silicon channel 46a, which is a part of a strained epitaxial silicon layer on a silicon substrate 40. In other words, the epitaxial silicon channel 46a having a nanometer size may be located between (and below) the reverse spacer 52, which is generally formed in a direction opposite to a typical gate spacer. An undoped epitaxial silicon layer 44 may be beneath the highly doped epitaxial silicon layer. In such a structure, carrier concentration(s) and electrical characteristics of the transistor may be improved by using the undoped epitaxial silicon layer 44.

A gate oxide layer (not shown) and a gate polysilicon layer 54 are sequentially formed on the epitaxial silicon channel 46a and at least in part on the reverse spacer 52, similar to the first embodiment. Source/drain terminals 64 include a first doped region 56 having a shallow junction in the silicon substrate 40 at a position exterior to the epitaxial silicon channel 46a and a second doped region 60 having a deep junction neighboring the first doped region 56.

A raised source/drain 50a may comprise another (e.g., a third) epitaxial silicon layer having dopant ions implanted therein, grown or otherwise formed on the second doped region 60. A metal silicide layer 62 is on the raised source/drain 50a and gate polysilicon layer 54.

Now, a method for manufacturing the transistor according to the second exemplary embodiment of the present invention will be described with reference to FIG. 7 to FIG. 12.

FIGS. 7 to 12 are cross-sectional views showing principal stages of manufacturing a semiconductor device according to the second exemplary embodiment of the present invention.

Figure 7:
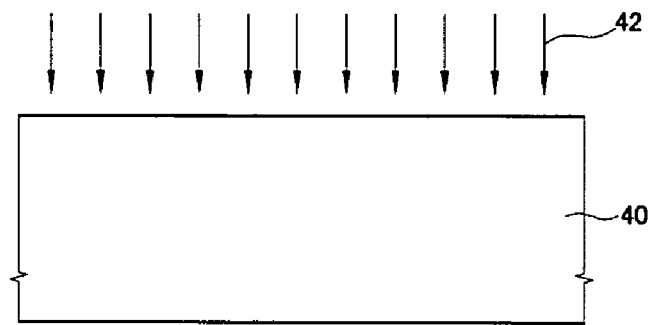
FIG. 7 to FIG. 12 are cross-sectional views showing principal stages of a semiconductor device according to a second exemplary embodiment of the present invention.

Referring to FIG. 7, an n-well and a p-well may be formed in a silicon substrate 40 by implantation of dopant ions 42. In FIG. 7, the n-well and the p-well are not shown.

Figure 8:
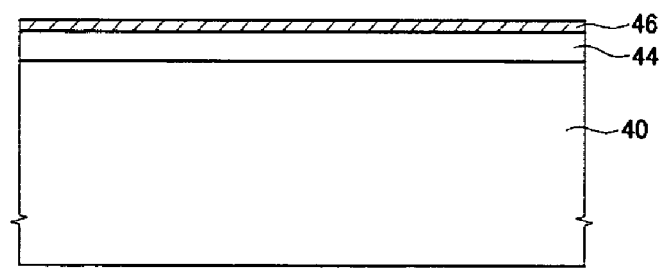
Figure 9:
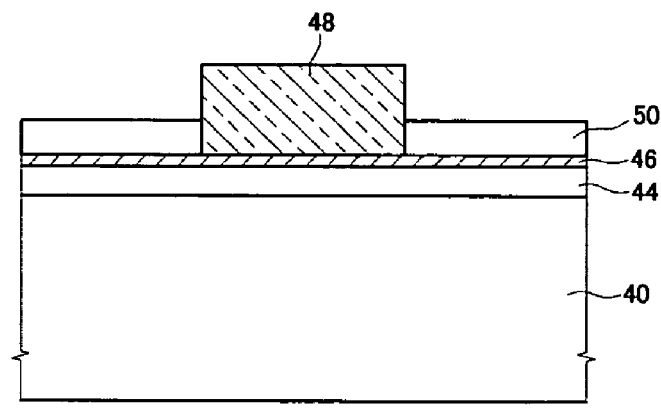

Referring to FIG. 8 and FIG. 9, an undoped first epitaxial silicon layer 44 and a highly doped second epitaxial silicon layer 46 are formed, typically by epitaxial growth as explained for the first embodiment, except that the highly doped second epitaxial silicon layer 46 may be formed by epitaxial growth of silicon in the presence of a dopant atom (such as B, P or As) or by conventional ion implantation (and optional annealing) into an undoped epitaxial silicon layer. Subsequently, a hard mask pattern 48 is formed on the second epitaxial silicon layer 46 as described above in the first embodiment, for forming a reverse spacer. A third epitaxial silicon layer 50 may be formed on the second epitaxial silicon layer 46 at positions expose by (or exterior to) the hard mask pattern 48.

Figure 10:
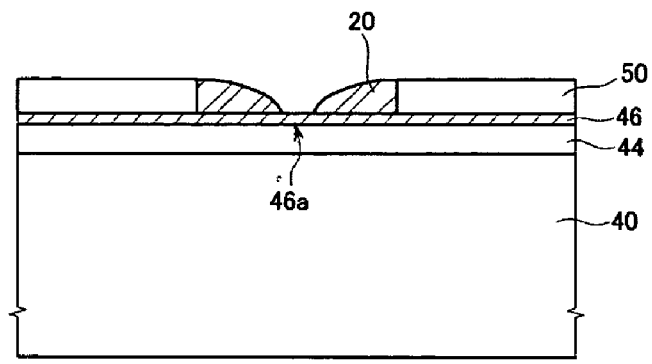

Referring to FIG. 10, after removing the hard mask, a reverse spacer 52 is formed on sidewalls of the third epitaxial silicon layer 50 so that an epitaxial silicon channel 46a is defined. The reverse spacer 52 is formed in a direction opposite to a typical gate spacer structure. A part of the second epitaxial silicon layer 46 between the reverse spacer 20 is exposed so as to form an epitaxial silicon channel 46a. The reverse spacer 52 may comprise a nitride (e.g., silicon nitride) or an oxide (e.g., silicon dioxide) as described above with regard to the first embodiment.

Figure 11:
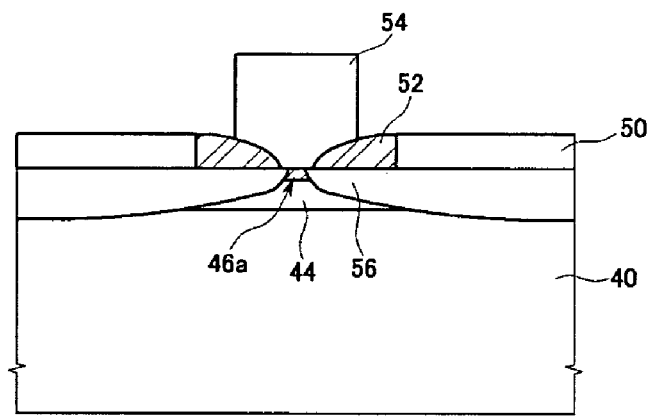

Referring to FIG. 11, a gate oxide layer (not shown) may be formed on the epitaxial silicon layer 46a as described above for the first embodiment, and a gate polysilicon layer 54 may be formed on the gate oxide layer and the reverse spacer 52. Subsequently, a first doped region 56 having a shallow junction is formed by implanting dopant ions into the silicon substrate 40 having the gate polysilicon layer 54 thereon so as to form an LDD structure (and optionally, a pocket structure). Such an adoption of the reverse spacer 52 enables a nanometer scale gate to be formed with a typical (e.g., ≧nanometer scale) process technology. In addition, an ultra-shallow junction without the help of an advanced implantation apparatus and using very low implantation energy can be formed under the gate polysilicon layer 54 by using the reverse spacer 52.

Figure 12:
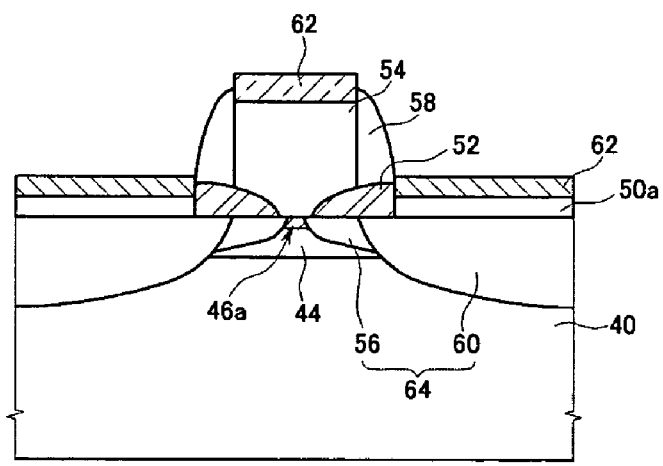

Referring to FIG. 12, after a gate spacer 58 is formed on sidewalls of the gate polysilicon layer 54 as described above for the first embodiment, a second doped region 60 having a deep junction may be formed by deep implantation of one or more dopants for source/drain junctions. Consequently, source/drain terminals 64 may include the first doped region 56 under the gate polysilicon layer 54 and the second doped region 60 neighboring the first doped region 56.

Subsequently, a metal silicide layer 62 may be formed on the gate polysilicon layer 54 and on the third epitaxial silicon layer 50 over the second doped region 60 by a silicidation process. During the silicidation process, if a lower part of the second epitaxial silicon layer 50 on the second doped region 60 is not silicided, then a raised (non-silicided) source/drain 50a may be formed.

In such a structure, an ultra-shallow junction in a silicon substrate and an improved parasitic resistance beneficial for a nanometer scale transistor can be obtained. In addition, adoption of the raised source/drain can reduce defects that may result from silicidation of germanium. According to the exemplary embodiment of the present invention, a nanoscale transistor can be formed, even if a typical (e.g., non-nanoscale) process technology is used.

As described above, according to the exemplary embodiment of the present invention, a transistor having an epitaxial silicon channel of nanometer size, an ultra-shallow junction, and a deep junction can be formed by using a reverse spacer. In addition, the exemplary embodiment of the present invention can be performed using typical (e.g., non-nanoscale) process technology.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor device, comprising:
   a reverse spacer exposing a part of an epitaxial silicon layer on a silicon substrate;
   a gate oxide layer on the epitaxial silicon layer;
   a gate polysilicon layer on the gate oxide layer and at least in part on the reverse spacer; and
   source/drain terminals comprising a first doped region in the silicon substrate at a position exterior to the exposed epitaxial silicon layer and a second doped region neighboring the first doped region.

2. The semiconductor device of claim 1, wherein the epitaxial silicon layer comprises strained silicon.

3. The semiconductor device of claim 1, wherein the first doped region has a shallow junction.

4. The semiconductor device of claim 1, wherein the second doped region has a deep junction.

5. The semiconductor device of claim 1, further comprising a raised source/drain layer on the second doped region.

6. The semiconductor device of claim 5, further comprising a metal suicide layer on the raised source/drain layer and on the gate polysilicon layer.

7. A semiconductor device, comprising:
   a reverse spacer exposing a part of a highly doped epitaxial silicon layer on a silicon substrate;
   an undoped epitaxial silicon layer under the highly doped epitaxial silicon layer;
   a gate oxide layer on the highly doped epitaxial silicon layer;
   a gate polysilicon layer on the gate oxide layer and at least in part on the reverse spacer; and
   source/drain terminals comprising a first doped region in the silicon substrate at a position exterior to the exposed highly doped epitaxial silicon layer and a second doped region neighboring the first doped region.

8. The semiconductor device of claim 7, wherein the epitaxial silicon layer comprises strained silicon.

9. The semiconductor device of claim 7, wherein the first doped region has a shallow junction.

10. The semiconductor device of claim 7, wherein the second doped region has a deep junction.

11. The semiconductor device of claim 7, further comprising a raised source/drain layer on the second doped region.

12. The semiconductor device of claim 11, further comprising a metal suicide layer on the raised source/drain layer and on the gate polysilicon layer.

13. A method of manufacturing a semiconductor device, comprising:
    introducing germanium ions into a silicon substrate;
    forming a first epitaxial silicon layer on the silicon substrate;
    forming a hard mask pattern on the first epitaxial silicon layer;
    forming a second epitaxial silicon layer on the first epitaxial silicon layer at a position exposed by the hard mask pattern;
    removing the hard mask pattern;
    forming a reverse spacer on a sidewall of the second epitaxial silicon layer so as to expose a part of the first epitaxial silicon layer;
    forming a gate oxide layer on at least the exposed first epitaxial silicon layer;
    forming a gate polysilicon layer on the gate oxide layer and at least in part on the reverse spacer;
    forming a shallow junction region in the substrate, at least in part under the reverse spacer;
    forming a gate spacer on sidewalls of the gate polysilicon layer; and
    forming a deep junction region neighboring the shallow junction region so as to form source/drain terminals.

14. The method of claim 13, further comprising introducing dopants into the second epitaxial silicon layer so as to form a raised source/drain.

15. The method of claim 14, further comprising forming a metal silicide layer on the raised source/drain and on the gate polysilicon layer.

16. A method of manufacturing a semiconductor device, comprising:
    sequentially forming an undoped first epitaxial silicon layer and a highly doped second epitaxial silicon layer on a silicon substrate;
    forming a hard mask pattern on the second epitaxial silicon layer;
    forming a third epitaxial silicon layer on the second epitaxial silicon layer at a position exterior exposed by the hard mask pattern;
    removing the hard mask pattern;
    forming a reverse spacer on a sidewall of the third epitaxial silicon layer so as to expose a part of the second epitaxial silicon layer;
    forming a gate oxide layer on at least the exposed second epitaxial silicon layer;
    forming a gate polysilicon layer on the gate oxide layer and at least in part on the reverse spacer;
    forming a first doped region under the reverse spacer;
    forming a gate spacer on sidewalls of the gate polysilicon layer; and
    forming a second doped region neighboring the first doped region so as to form source/drain terminals.

17. The method of claim 16, further comprising introducing dopants into the third epitaxial silicon layer so as to form a raised source/drain.

18. The method of claim 17, further comprising forming a metal silicide layer on the raised source/drain and on the gate polysilicon layer.

19. The method of claim 16, wherein the first doped region has a shallow junction.

20. The method of claim 16, wherein the second doped region has a deep junction.

* * * * *